United States Patent
Mueller-Mach et al.

(10) Patent No.: US 6,696,703 B2
(45) Date of Patent: *Feb. 24, 2004

(54) THIN FILM PHOSPHOR-CONVERTED LIGHT EMITTING DIODE DEVICE

(75) Inventors: Regina B. Mueller-Mach, San Jose, CA (US); Gerd O. Mueller, San Jose, CA (US)

(73) Assignee: Lumileds Lighting U.S., LLC, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/405,938

(22) Filed: Sep. 27, 1999

(65) Prior Publication Data

US 2002/0030444 A1 Mar. 14, 2002

(51) Int. Cl.$^7$ ................................. H01L 33/00
(52) U.S. Cl. ...................... 257/98; 257/79; 257/80; 257/82; 257/89; 257/93; 257/99; 257/103; 257/918
(58) Field of Search ........................ 257/14, 15, 18, 257/20, 22, 94, 95, 96, 98, 103; 313/463, 467, 468, 473, 501, 502, 505

(56) References Cited

U.S. PATENT DOCUMENTS 3,664,866 A  * 5/1972 Manasevit .................. 117/201
5,804,834 A  * 9/1998 Shimoyama et al. ......... 257/22

(List continued on next page.)

FOREIGN PATENT DOCUMENTS

EP           1 017 111         7/1997

(List continued on next page.)

OTHER PUBLICATIONS

Mueller–Mach, R. et al.: "White light emitting diodes for illumination" Light–Emitting Diodes: Research, Manufacturing, and Applications IV, San Jose, Jan. 2000, vol. 3938, pp. 30–41, XP000974983, ISSN: 0277–786X.

(List continued on next page.)

Primary Examiner—Wael Fahmy
Assistant Examiner—Wai-Sing Louie
(74) Attorney, Agent, or Firm—Patent Law Group LLP

(57) ABSTRACT

The present invention provides a phosphor-converted LED device comprising one or more phosphor thin films that convert primary light emitted by the LED into one or more other wavelengths of light to produce light of a particular color. Each phosphor thin film comprises dopant ions that are statistically spatially distributed in such a manner that the phosphor conversion of the primary light is predictable and controlled by the concentration of the dopants and by the thickness of the thin film. Therefore, variations in the color of the light produced by phosphor-converted LED devices can be eliminated, thereby enabling uniformity in the quality of the colored light produced to be ensured. In accordance with one embodiment of the present invention, a single phosphor thin film is comprised by the LED device. The thin film converts a portion of the primary emission into yellow light while allowing a portion of the primary blue light to pass through the thin film. The primary light and the yellow light combine to produce white light. Alternatively, a plurality of phosphor thin films, each of which emits a different color of light, may be comprised in the LED device. Each of the thin films converts a portion of primary radiation into a particular color of light, e.g., red or green light. The red light, green light and the unconverted primary light combine to form white light. Alternatively, one of the thin films completely absorbs the primary radiation and converts it into blue light. This converted blue light then functions as the primary light that undergoes phosphor conversion via one or more other phosphor thin films to produce white light. One or more thin films may be used in this manner to perform phosphor conversion to produce light of colors other than white, such as green light.

26 Claims, 3 Drawing Sheets

U.S. PATENT DOCUMENTS

| | | | | |
|---|---|---|---|---|
| 5,813,752 A | * | 9/1998 | Singer et al. | 362/293 |
| 5,813,753 A | | 9/1998 | Vriens et al. | 362/293 |
| 5,847,507 A | | 12/1998 | Butterworth et al. | 313/512 |
| 5,939,825 A | * | 8/1999 | Sun et al. | 313/503 |
| 5,952,681 A | | 9/1999 | Chen | 257/89 |
| 5,957,560 A | | 9/1999 | Do et al. | 353/88 |
| 5,959,316 A | | 9/1999 | Lowery | 257/98 |
| 5,998,925 A | | 12/1999 | Shimizu et al. | 313/503 |
| 6,066,861 A | * | 5/2000 | Holn et al. | 257/99 |
| 6,086,673 A | | 7/2000 | Molnar | 117/90 |
| 6,212,213 B1 | | 4/2001 | Weber et al. | 372/50 |
| 6,252,254 B1 | * | 6/2001 | Soules et al. | 257/89 |
| 6,273,589 B1 | | 8/2001 | Weber et al. | 362/293 |
| 6,288,417 B1 | * | 9/2001 | Nickel et al. | 257/103 |

FOREIGN PATENT DOCUMENTS

| | | | | |
|---|---|---|---|---|
| JP | 10 163526 | 6/1998 | | H01L/33/00 |
| WO | WO 97/48138 | 12/1997 | | H01L/33/00 |
| WO | WO 97/50132 | 12/1997 | | H01L/33/00 |
| WO | WO 98/19290 | 5/1998 | | G09F/13/22 |
| WO | WO 00/33389 | 11/1999 | | |
| WO | WO 00/33390 | 11/1999 | | |
| WO | WO 00/38250 | 6/2000 | | H01L/33/00 |

OTHER PUBLICATIONS

Tanaka, S. et al.: "Bright White–Light EL Devices with New Phosphor Thin Films Based on SrS" Proceedings of the SID, 1988, vol. 29, No. 4, pp. 305–310, XP000115936.

* cited by examiner

WHITE LIGHT

WHITE LIGHT

THIN FILM PHOSPHOR-CONVERTED LIGHT EMITTING DIODE DEVICE

TECHNICAL FIELD OF THE INVENTION

The present invention relates to light emitting diodes (LEDs) and, more particularly, to a phosphor-converted LED device that utilizes one or more phosphor thin films for converting primary light emitted by the LED into one or more other frequencies of light in order to generate white light.

BACKGROUND OF THE INVENTION

With the development of efficient LEDs that emit blue or ultraviolet (UV) light, it has become feasible to produce LEDs that generate white light through phosphor conversion of a portion of the primary emission of the LED to longer wavelengths. Conversion of primary emission of the LED to longer wavelengths is commonly referred to as down-conversion of the primary emission. An unconverted portion of the primary emission combines with the light of longer wavelength to produce white light. LEDs that produce white light are useful for signaling and/or illumination purposes.

Currently, state-of-the-art phosphor conversion of a portion of the primary emission of the LED is attained by placing a phosphor in an epoxy that is used to fill the reflector cup, which houses the LED within the LED lamp. The phosphor is in the form of a powder that is mixed into the epoxy prior to curing the epoxy. The uncured epoxy slurry containing the phosphor powder is then deposited onto the LED and is subsequently cured.

The phosphor particles within the cured epoxy generally are randomly oriented and interspersed throughout the epoxy. A portion of the primary light emitted by the LED passes through the epoxy without impinging on the phosphor particles, whereas a portion of the primary light emitted by the LED impinges on the phosphor particles, thereby causing the phosphor particles to emit complimentary light. The combination of the primary blue light and the phosphor-emitted light produces white light. One disadvantage of utilizing the epoxy comprising the phosphor particles is that uniformity in the white light emitted by the LED is difficult, if not impossible, to obtain. This non-uniformity is caused by non-uniformity in the sizes of the phosphor particles mixed into the epoxy slurry. Currently, phosphor powders having uniform phosphor particle sizes generally are not available. When the phosphor powder is mixed into the epoxy slurry, the larger phosphor particles sink faster than the smaller phosphor particles. This non-uniformity in spatial distribution of the phosphor particles exists in the epoxy once it has been cured.

Therefore, obtaining a uniform distribution of the phosphor particles within the epoxy is very difficult, if not impossible, due to the non-uniformity of the sizes of the phosphor particles. This inability to control the sizes of the phosphor particles and their locations within the epoxy results in difficulties in producing LED lamps that emit white light in a consistent manner. Therefore, the quality of the white light produced by LED lamps may vary from one lamp to another, even for a given model manufactured by a particular manufacturer.

Attempts have been made to overcome the disadvantages of using phosphor powders mixed with epoxies by placing luminescent organic dye films on a lens that encases the LED. The dye is carefully positioned on the lens at a particular location so that it totally absorbs all of the primary light impinging thereon and converts the primary light to light of a longer wavelength. A fraction of the primary light emitted passes through the lens without impinging on the dye. The primary light that does not impinge on the dye then combines with the longer-wavelength light to produce white light. Since the dye totally absorbs the primary light impinging thereon, any variation in the fraction of the primary light that is summed with the longer-wavelength light is supposed to be eliminated.

However, this latter approach also has several disadvantages. The placement of the dye on the lens is subject to manufacturing uncertainties, which may result in variations in the white light produced. Also, dyes that are stable over long periods of time generally are not available. As a result, wide spread use of wavelength-converting dyes has not occurred.

Accordingly, a need exists for a phosphor-converted LED that overcomes these problems and disadvantages.

SUMMARY OF THE INVENTION

The present invention provides a phosphor-converted LED device comprising one or more phosphor thin films that convert primary light emitted by the LED into one or more other wavelengths of light to produce light of a particular color. The phosphor thin film of the invention comprises dopants that are spatially distributed in an optically homogeneous manner. This optically-homogeneous spatial distribution of the dopants in the thin film causes the phosphor conversion of the primary light to occur in a manner that is predictable and controllable. Therefore, variations in the color of the light produced by phosphor-converted LED devices can be eliminated, thereby enabling consistency in the quality of the colored light produced by LED devices to be achieved. Preferably, the light of the particular color that is produced by the LED device is white light. However, the phosphor-converted LED device of the present invention may be designed to perform phosphor conversion to produce light of other colors, such as green light.

In accordance with one embodiment of the present invention, a single phosphor thin film is comprised by the LED device. The thin film converts a portion of the blue primary light into yellow light while allowing a portion of the primary light to pass through the thin film. The primary light and the yellow light combine to produce white light.

In accordance with an alternative embodiment of the present invention, at least two phosphor thin films, each of which emits a different color of light, are comprised in the LED device. In accordance with this embodiment, the thin films preferably are disposed one on top of the other. Each of the thin films converts a portion of the primary light into a particular color of light. For example, one of the thin films may convert primary light into green light and one of the films may convert primary light into red light. The red light, green light and the unconverted primary light combine to form white light.

In accordance with another embodiment of the present invention, at least two phosphor thin films are utilized and one of the thin films completely absorbs the primary light and converts it into blue light. The other thin film then converts a portion of the blue light emitted by the first thin film into a broad yellow emission, which then combines with the blue emission to produce white light.

Other features and advantages of the present invention and variations thereof will become apparent from the following description, drawings and claims.

BRIEF DESCRIPTION OF THE INVENTION

DETAILED DESCRIPTION OF THE DRAWINGS

Figure 1:
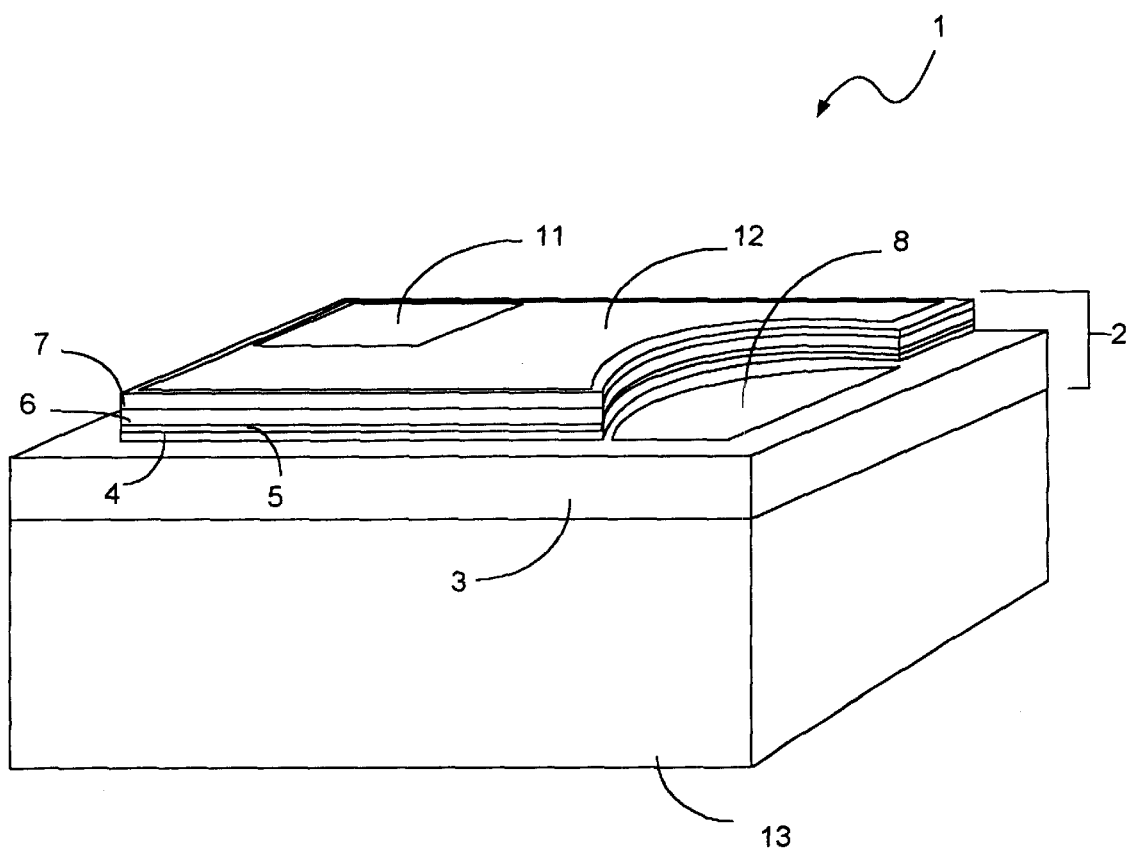
FIG. 1 is a perspective view of the light emitting diode device of the present invention before a phosphor thin film has been deposited thereon.

FIG. 1 is a perspective view of a light emitting diode (LED) 1 that is suitable for incorporating one or more phosphor thin films therein in accordance with the present invention. However, it should be noted that the LED of the present invention is not limited to any particular LED. Those skilled in the art will understand that a variety of known LEDs are suitable for use with the present invention.

For purposes of describing the typical components of the LED 1, the LED 1 has been shown without any phosphor thin films disposed thereon. The LED 1 may comprise, for example, a light emitting structure 2, which comprises two n-GaN layers 3 and 4, an SQW or MQW GaInN layer 5, a p-AlGaN layer 6 and a p-GaN layer 7. The light emitting structure 2 also comprises an n-electrode bond pad 8, an n-electrode 3, a p-electrode bond pad 11 and a p-electrode 12. The n-electrode 3 is comprised of GaN and the p-electrode 12 is either transmissive or reflective, as discussed below in more detail. The electrode bond pads 8 and 11, when connected to a power supply (not shown), provide the biasing current for causing the LED 1 to emit light.

The light emitting structure 2 is disposed on a substrate 13, which preferably is sapphire, although other materials may be used for the substrate 13. It should be noted that the materials used for creating the light emitting diode 1 are not limited to the materials discussed above with reference to FIG. 1. Those skilled in the art will understand that the light emitting diode 1 can be comprised of various types of materials. As stated above, the light emitting diode 1 is not limited to any particular type of light emitting diode, with the exception that the light emitting diode device utilized in accordance with the present invention emits a primary light that is either blue or ultraviolet, as discussed below in detail. Those skilled in the art will understand that various light emitting diodes are known that are suitable for this purpose.

The light emitting structure 2 that generates the blue or UV primary emission preferably is grown epitaxially on either a sapphire (i.e., $Al_2O_3$) or silicon carbide (i.e., SiC) substrate. Since both of these substrate materials are transparent to the primary radiation emission, the LED 1 can be mounted on a header (not shown) or in a reflector cup (not shown) in either a "normal" mounting configuration or a "flipchip" mounting configuration, which are known to those skilled in the art. As discussed below in detail, in some cases the substrate material may be transmissive, whereas in other cases it may be opaque. Those skilled in the art will understand that many substrate materials are suitable for these purposes.

Figure 2:
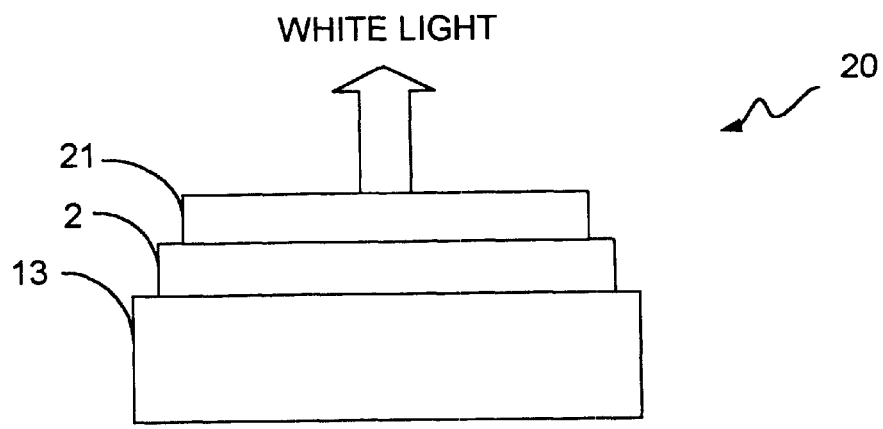
FIG. 2 is a side view of the light emitting diode device of the present invention in accordance with a first embodiment.

FIG. 2 is a side view of the LED device of the present invention in accordance with a first embodiment. The LED device 20 comprises a substrate 13 and an LED structure 2, as shown in FIG. 1. In accordance with this embodiment of the present invention, a single phosphor thin film 21 is disposed on the surface of the light emitting structure 2 opposite the surface of the light emitting structure 2 that is in contact with the substrate 13. The phosphor thin film 21 may be deposited on the light emitting structure 2 by a plurality of known methods. Phosphor thin films have been used primarily in the thin film electroluminescent display industry. Several known techniques may be used for depositing the phosphor thin film such as, for example, electron beam evaporation, thermal evaporation, rf-sputtering, chemical vapor deposition and atomic layer epitaxy.

The method that is utilized for depositing the thin film may depend on the desired characteristics of the thin film. For example, if the thin film is to absorb all of the primary radiation emitted by the LED, one particular deposition technique may be used, whereas if the thin film is to allow a percentage of the primary radiation to pass through it, a different technique may be used. Those skilled in the art will understand which type of technique is to be utilized in order to obtain a thin film having the desired characteristics.

Preferably, the method for depositing the thin film 21 shown in FIG. 2 is RF-sputtering. In accordance with this method, the phosphor powder is pressed into a target of a diameter slightly exceeding the LED wafer diameter such that a homogenous distribution of the phosphor film is ensured. As will be understood by those skilled in the art, the sputter gas characteristics can vary, but preferably the sputter gas mainly comprises Argon, but also comprises approximately 1% to approximately 3% of oxygen. The pressure and RF power input are matched to provide the thin film 21 with optimum thickness and homogeneity. The distance between the target and the substrate preferably is approximately 5 to 10 centimeters. The phosphor powder preferably is a Cerium-doped Yttrium-Aluminum-Garnet ($Y_3Al_5O_{12}$:$Ce^{3+}$), also denoted as YAG:Ce. Those skilled in the art will understand that the present invention is not limited to using any particular type of phosphor for the thin film. Those skilled in the art will understand that other types of phosphors exist that are suitable for this purpose.

Preferably, the phosphor thin film is deposited after the light emitting structure 2 has been grown on the substrate 13. However, this may not always be possible, due to the fact that the deposition conditions might be incompatible with the requirements for maintaining the integrity of the light emitting structure 2. Therefore, in some cases, it may be necessary to deposit the thin film before the light emitting structure is grown.

The homogeneity of the composition and the thickness of the thin film can be further improved by rotating the LED wafer on a particular trajectory, such as eccentric circles, or on more complicated trajectories, which are sometimes referred to as "planetary motion". This technique of rotating the wafer to improve the homogeneity of a material is known in the art. Since the manner in which phosphor thin films having a desired homogeneity can be created and deposited is known, no further discussion of the manner in which this is accomplished will be provided herein.

During operation, the light emitting structure 2 generates primary blue radiation. The primary emission impinges on the thin film 21. A portion of the primary emission passes through the thin film 21 without exciting the dopants in the thin film. A portion of the primary emission impinging on the thin film 21 is absorbed by the dopants contained in the thin film and is converted into yellow light. This yellow light is emitted from the thin film 21 and combines with the portion of the unconverted primary radiation to form white light. The dopants are incorporated on an atomic scale into the phosphor thin film 21. When these dopants are excited by primary radiation, the dopants emit yellow light.

The total amount of dopants in the thin film is determined by their concentration and by the thickness of the thin film. The spatial distribution of the dopants in the thin film can be controlled with great precision. The techniques used for this purpose are common to thin film deposition processes used in the industry and are known to those skilled in the art. Those skilled in the art will understand the manner in which the amount of light-emitting dopants in the thin film and the spatial distribution of the dopants can be precisely controlled. By precisely controlling these characteristics of the thin film, the fraction of the primary radiation that will pass through the thin film without conversion is predictable and can be controlled. Therefore, the characteristics of the white light produced by the light emitting diode device 20 can be ensured. Thus, manufacturing uncertainties can be eliminated and LED devices having high quality and consistency can be obtained.

It should be noted that the primary light may comprise light having more than one wavelength. Similarly, the light emitted in response to excitation by the primary light may comprise light of more than one wavelength. For example, the blue light emitted by thin film 21 may correspond to a plurality of wavelengths making up a spectral band. Wavelengths this spectral band may then combine with the unconverted primary light to produce white light. Therefore, although individual wavelengths are discussed herein for purposes of explaining the concepts of the present invention, it will be understood that the excitation being discussed herein may result in a plurality of wavelengths, or a spectral band, being emitted. Wavelengths of the spectral bands may then combine to produce white light. Therefore, the term "spectral band" is intended to denote a band of at least one wavelength and of potentially many wavelengths, and the term "wavelength" is intended to denote the wavelength of the peak intensity of a spectral band.

Figure 3:
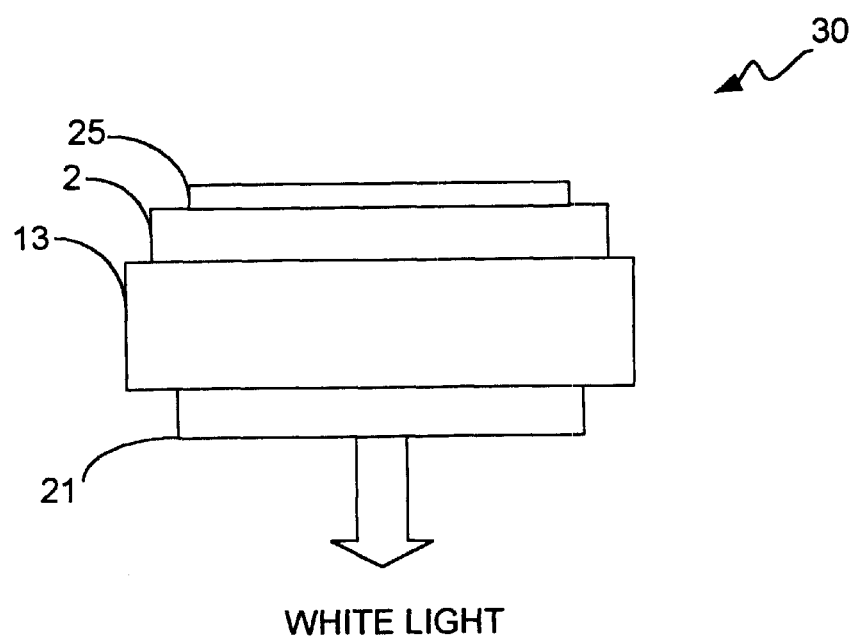
FIG. 3 is a side view of the light emitting diode device of the present invention in accordance with a second embodiment.

FIG. 3 is a side view of the light emitting diode device 30 of the present invention in accordance with an alternative embodiment. In accordance with this embodiment, a reflective electrode bond pad 25 is disposed on a surface of the light emitting structure 2 and the phosphor thin film 21 is disposed on a surface of the substrate 13 opposite the surface of the substrate 13 that is in contact with the light emitting structure 2. As stated above, the preferred substrate material is transparent. Therefore, the primary radiation emitted from the light emitting structure 2 that impinges on the reflective electrode bond pad 25 is reflected through the light emitting structure 2 and through the substrate 13 into the phosphor thin film 21. Once the primary radiation impinges on the phosphor thin film 21, the results are essentially identical to those discussed above with reference to the operations of the LED device 20 of FIG. 2. The phosphor thin film shown in FIG. 3 may be identical to the phosphor thin film shown in FIG. 2 and may also be created using the above-discussed rf-sputtering technique.

Since, in accordance with this embodiment, the phosphor thin film 21 is deposited directly onto the substrate 13, the phosphor thin film 21 may be deposited either before or after the light emitting structure 2 has been created and either before or after the reflective electrode bond pad 25 has been created.

Figure 4:
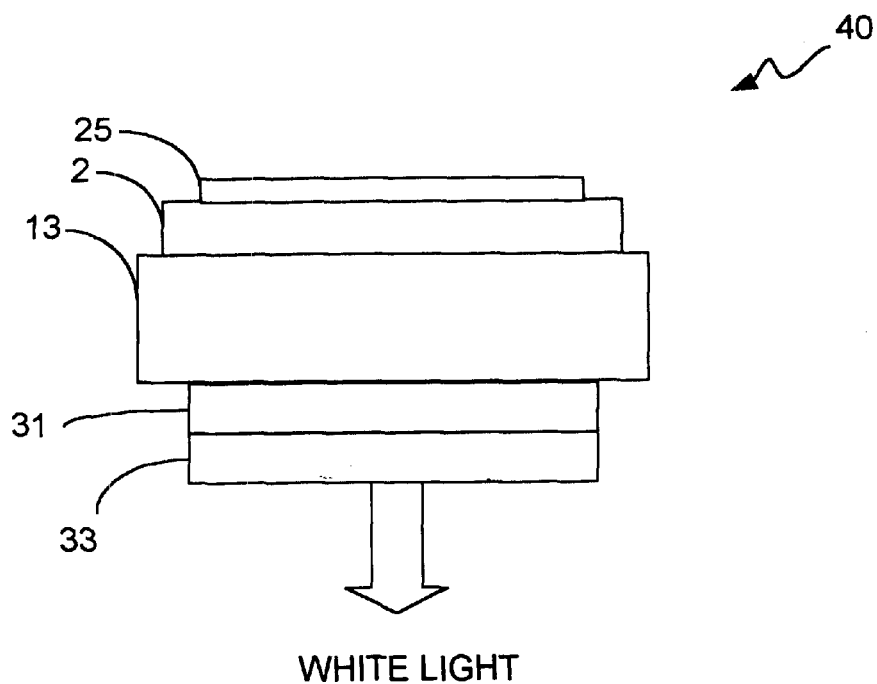
FIG. 4 is a side view of the light emitting diode device of the present invention in accordance with a third embodiment.

FIG. 4 is a side view of the light emitting diode device 40 of the present invention in accordance with an alternative embodiment in which the LED device 40 comprises at least two phosphor thin films 31 and 33. The thin films 31 and 33 are deposited on the side of the substrate 13 opposite the side of the substrate 13 on which the light emitting structure 2 is to be disposed. In accordance with this embodiment, the phosphor thin films 31 and 33 preferably are deposited using atomic layer epitaxy. Preferably the thin film 31 disposed on the substrate 13 produces red emissions in response to the blue or ultraviolet primary emissions impinging on the light-emitting dopants contained in the thin film 31. The phosphor thin film 33 disposed on phosphor thin film 31 emits green light in response to the blue or ultraviolet primary emissions impinging on the dopants contained in the thin film 33.

The red light emitted by thin film 31 is not absorbed by thin film 33. However, the green light emitted by thin film 33 is partly absorbed by thin film 31, and is converted into red light. Both of the thin film layers allow a portion of the primary blue light emitted by the light emitting structure 2 to pass through the thin films. This unconverted primary blue light combines with the red and green light emitted by thin film layers 31 and 33, respectively, to produce white light.

The thin film 33 that emits green light preferably is comprised of SrS:Ce and the thin film 31 that emits red light preferably is comprised of SrS:Eu. However, those skilled in the art will understand that the present invention is not limited with respect to the materials utilized for these thin films or with respect to the manner in which these thin films are deposited. The reflective electrode bond pad 25 reflects primary light generated by the light emitting structure 2 toward the thin films 31 and 33 and improves the efficiency of the LED device 40.

Alternatively, a thin film 31 totally absorbs all of the primary light and converts the primary light into blue light. Thin film 33 passes some of the blue light and converts some of the blue light into yellow light. The yellow light and the unconverted blue light combine to form white light, in the same manner described above with reference to FIGS. 2 and 3.

Figure 5:
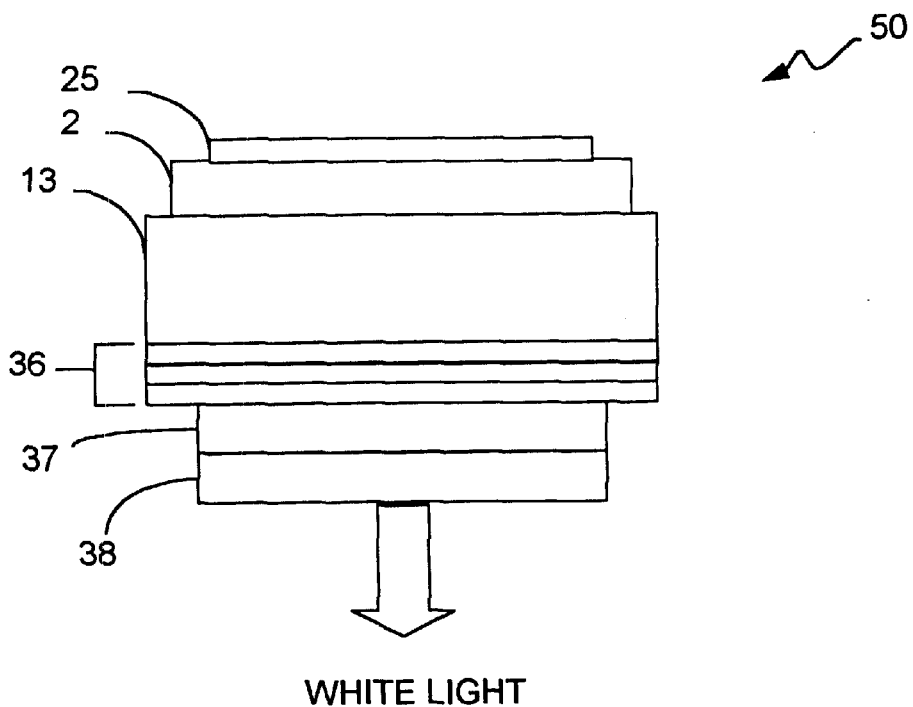
FIG. 5 is a side view of the light emitting diode device of the present invention in accordance with a fourth embodiment.

FIG. 5 is a side view of the light emitting diode device 50 of the present invention in accordance with another embodiment. This embodiment of the present invention also utilizes a plurality of phosphor thin films 37 and 38. However, in accordance with this embodiment, a dielectric mirror 36 is disposed between thin film 37 and the substrate 13. The dielectric mirror 36 is fully transparent to the primary emission of the light emitting structure 2 but is highly reflective at the wavelength of the emissions of the phosphor thin films 37 and 38. The phosphor thin films 37 and 38 may be identical to the phosphor thin films 31 and 33 shown in FIG. 4. Thus, the phosphor thin films 37 and 38 may produce red and green light, respectively, or blue and yellow light, respectively. Preferably, atomic layer epitaxy is used to deposit the thin films 37 and 38 in the manner discussed above with reference to FIG. 4.

Incorporating the dielectric mirror 36 into the LED device 50 increases the overall efficiency of the LED device 50 by isolating the light emitting structure 2 from luminescence light produced by the phosphor thin films 37 and 38, which might otherwise be re-absorbed by the light emitting structure 2. The thin films 37 and 38 of FIG. 5 operate in a manner that is essentially identical to the manner in which the thin films 31 and 33 of FIG. 4 operate to produce white light. The red and green light emitted by thin films 37 and 38, respectively, combines with the unconverted primary light emitted by the light emitting structure 2 to produce white light.

The phosphor thin film 37 preferably is deposited onto the dielectric mirror 36 and then the phosphor thin film 38 is deposited onto the phosphor thin film 37. It should be noted that the present invention is not limited with respect to the order in which the layers of the LED device 50 are incorporated into the LED device 50. For example, the phosphor thin films can be deposited after the dielectric mirror 36 has been fabricated on the substrate, but before the light emitting structure 2 and the reflective electrode 25 have been fabricated. Alternatively, the phosphor thin films 37 and 38 may be deposited after all of the other layers, including the dielectric mirror 36, the light emitting structure 2 and the reflective electrode 25, have been formed.

It will be understood by those skilled in the art that the present invention has been described with reference to particular embodiments, but that the present invention is not limited to these embodiments. Those skilled in the art will understand that various modifications may be made to the embodiments discussed above, which are within the scope of the present invention. As stated above, the present invention is not limited with respect to the materials used in the LED device, except that the LED device must be capable of generating primary emissions that are blue light or ultraviolet light. Those skilled in the art will also understand that, unless expressly stated herein, the present invention is not limited with respect to the order in which the layers or components of the LED device are formed. It will also be understood by those skilled in the art that the geometric arrangement or configuration of the phosphor thin films is not limited to any particular arrangement.

For example, rather than using overlapping phosphor thin films in the manner described above with reference to FIGS. 4 and 5, a plurality of phosphor thin film segments, each of which luminesces a different color of light in response to blue or ultraviolet primary radiation impinging thereon, may be deposited on a common surface. For example, three different phosphor thin films segments (not shown) could be deposited in a checker-board configuration on the dielectric mirror 36 shown in FIG. 5. In this case, one of the thin film segments would luminesce red light, one would luminesce green light and one would luminesce or transmit blue light, depending on whether the primary light is UV or blue. The segments would be arranged to effect total absorption of the primary radiation emitted from the light emitting structure 2. The red, green and blue light generated by the respective phosphor thin films would then combine to create white light. Those skilled in the art will understand how various other configurations of thin film layers and segments could be incorporated into an LED device to produce an LED device that generates white light.

Furthermore, it should be noted that it is not required that white light be produced by the LED device of the present invention. Those skilled in the art will understand the manner in which a phosphor thin film can be produced and utilized in accordance with the principles of the present invention to obtain an LED device that produces other colors of light. For example, those skilled in the art will understand, in view of the description provided herein, how a phosphor thin film may be obtained that produces green light by totally absorbing the blue or UV primary emission.

What is claimed is:

1. A light emitting diode device for generating light of a particular color, the light emitting diode device comprising:
   a light emitting structure emitting primary radiation when driven;
   a phosphor thin film comprising dopants spatially distributed in an optically homogeneous manner, and consisting essentially of phosphor, the phosphor thin film located to receive the primary radiation and converting only a portion of the received primary radiation into light of a different wavelength; and
   a substrate located between the light emitting structure and the phosphor thin film, the substrate being substantially transparent to the primary radiation.

2. The light emitting diode device of claim 1, wherein a reflective electrode is disposed on a surface of the light emitting structure farthest from the substrate, wherein primary radiation that impinges on the reflective electrode is reflected by the reflective electrode toward the light emitting structure.

3. The light emitting diode device of claim 2, wherein the primary radiation is blue light.

4. A light emitting diode device for generating light of a particular color, the light emitting diode device comprising:
   a substrate including a first surface and a second surface, the first surface being opposite the second surface;
   a light emitting structure disposed on the first surface of the substrate, the light emitting structure having a first surface facing the first surface of the substrate, the light emitting structure having a second surface opposite the first surface of the light emitting structure, the light emitting structure emitting primary radiation when driven;
   an optically homogeneous first phosphor thin film consisting essentially of phosphor, the first phosphor thin film disposed on only one or more light emitting surfaces of the light emitting diode device and located to receive primary radiation generated by the light emitting structure, the primary radiation impinging on the first phosphor thin film, a first portion of the primary radiation passing through the first phosphor thin film, and a second portion of the primary radiation being converted into light of a first wavelength; and
   an optically homogeneous second phosphor thin film consisting essentially of phosphor and located to receive third and fourth portions of the primary radiation generated by the light emitting structure, the fourth portion of the primary radiation being converted into light of a second wavelength, wherein the first and third portions of the primary radiation remain unconverted and combine with the light of the first and second wavelengths emitted by the first and second phosphor thin films, respectively, to produce said light of the particular colors.

5. The light emitting diode device of claim 4, wherein the one or more light emitting surfaces of the light emitting diode device includes the second surface of the substrate, and wherein the light emitting diode device further comprises a reflective electrode, the reflective electrode being disposed on the second surface of the light emitting structure, wherein primary radiation emitted by the light emitting structure that impinges on the reflective electrode is reflected toward the light emitting structure.

6. The light emitting diode device of claim 5, wherein the primary radiation is blue light.

7. A light emitting diode device for generating light of a particular color, the light emitting diode device comprising:
   a substrate including a first surface and a second surface, the first surface being opposite the second surface;
   a light emitting structure disposed on the first surface of the substrate, the light emitting structure having a first surface facing the first surface of the substrate, the light emitting structure having a second surface opposite the first surface of the light emitting structure, the light emitting structure emitting primary radiation when driven;

a dielectric mirror disposed on the second surface of the substrate, the dielectric mirror comprising at least first and second surfaces, the first surface of the dielectric mirror being opposite the second surface of the dielectric mirror, the first surface of the dielectric mirror being in contact with the second surface of the substrate, the dielectric mirror being transparent to the primary radiation;

an optically homogeneous first phosphor thin film consisting essentially of phosphor and disposed on the second surface of the dielectric mirror, the primary radiation impinging on the first phosphor thin film, a first portion of the primary radiation passing through the first phosphor thin film, and a second portion of the primary radiation being converted into light of a first wavelength, the dielectric mirror being reflective to light of the first wavelength; and an optically homogeneous second phosphor thin film consisting essentially of phosphor and disposed adjacent the first phosphor thin film, a first portion of the primary radiation passing through the second phosphor thin film, and a second portion of the primary radiation being converted into light of a second wavelength, wherein the portion of the primary radiation that passes through the first and second phosphor thin films combines with the light emitted from the first phosphor thin film and the light emitted from the second phosphor thin film to produce said light of the particular color.

8. The light emitting diode device of claim 7, wherein the light emitting diode device further comprises a reflective electrode, the reflective electrode being disposed on the second surface of the light emitting structure, wherein primary radiation emitted by the light emitting structure that impinges on the reflective electrode is reflected toward the light emitting structure.

9. The light emitting diode device of claim 8, wherein the primary radiation is blue light.

10. A light emitting diode device for generating light of a particular color, the light emitting diode device comprising:

a substrate having at least a first surface and a second surface, the first surface being opposite the second surface;

a light emitting structure disposed on the first surface of the substrate, the light emitting structure having a first surface facing the first surface of the substrate, the light emitting structure having a second surface opposite the first surface of the light emitting structure, the light emitting structure emitting primary radiation when driven;

an optically homogeneous first phosphor thin film consisting essentially of phosphor, the first phosphor thin film disposed on only one or more light emitting surfaces of the light emitting diode device and located to receive primary radiation generated by the light emitting structure, the primary radiation impinging on the first phosphor thin film, all the primary radiation impinging on the first phosphor thin film being converted into blue light, the blue light being emitted by the first phosphor thin film; and an optically homogeneous second phosphor thin film consisting essentially of phosphor and disposed on the first phosphor thin film, a portion of the blue light passing through the second phosphor thin film, and wherein a portion of the blue light that impinges on the second phosphor thin film is converted into yellow light, wherein the portion of the blue light that passes through the second phosphor thin film combines with the yellow light emitted from the second phosphor thin film to produce said light of the particular color.

11. The light emitting diode device of claim 10, wherein the one or more light emitting surface of the light emitting diode device includes the second surface of the substrate, and wherein the light emitting diode device further comprises a reflective electrode, the reflective electrode being disposed on the second surface of the light emitting structure, wherein primary radiation emitted by the light emitting structure that impinges on the reflective electrode is reflected toward the light emitting structure.

12. The light emitting diode device of claim 11, wherein the primary radiation is ultraviolet radiation.

13. The light emitting diode device of claim 4, wherein the light of a particular color is white light.

14. The light emitting diode device of claim 7, wherein the light of a particular color is white light.

15. The light emitting diode device of claim 10, wherein the light of a particular color is white light.

16. The light emitting diode device of claim 1, wherein the phosphor thin film is deposited using electron beam evaporation.

17. The light emitting diode device of claim 1, wherein the phosphor thin film is deposited using thermal evaporation.

18. The light emitting diode device of claim 1, wherein the phosphor thin film is deposited using rf sputtering.

19. The light emitting diode device of claim 1, wherein the phosphor thin film is deposited using chemical vapor deposition.

20. The light emitting diode device of claim 1, wherein the phosphor thin film is deposited using atomic layer epitaxy.

21. The light emitting diode device of claim 1, wherein the substrate includes silicon carbide.

22. The light emitting diode device of claim 1, wherein the substrate includes sapphire.

23. The light emitting diode device of claim 1, wherein the light emitting structure and the phosphor thin film are adjacent to opposite surfaces of the substrate.

24. The light emitting diode device of claim 1, wherein the phosphor thin film comprises $Y_3Al_5O_{12}:Ce^{3+}$.

25. The light emitting diode device of claim 1, wherein the phosphor thin film is a first phosphor thin film, further comprising a second phosphor thin film adjacent to the first phosphor thin film.

26. The light emitting diode device of claim 25, further comprising a third phosphor thin film adjacent to the second phosphor thin film.

* * * * *